(12) United States Patent
Koo

(10) Patent No.: US 7,883,836 B2
(45) Date of Patent: Feb. 8, 2011

(54) METHOD FOR FORMING FINE PATTERN WITH A DOUBLE EXPOSURE TECHNOLOGY

(75) Inventor: Sun Young Koo, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 552 days.

(21) Appl. No.: 11/647,325

(22) Filed: Dec. 29, 2006

(65) Prior Publication Data

US 2008/0026327 A1  Jan. 31, 2008

(30) Foreign Application Priority Data

Jul. 14, 2006 (KR) .................. 10-2006-0066319

(51) Int. Cl.
G03F 7/26 (2006.01)
(52) U.S. Cl. ..................... 430/313; 430/311
(58) Field of Classification Search ............. 430/311, 430/313, 394
See application file for complete search history.

(56) References Cited

U.S. PATENT DOCUMENTS 5,741,625 A * 4/1998 Bae et al. .................. 430/312
5,925,578 A * 7/1999 Bae .......................... 438/736
6,716,761 B2 4/2004 Mitsuiki

FOREIGN PATENT DOCUMENTS

| KR | 10-1998-0005323 | 3/1998 |
| KR | 1020000047051 A | 7/2000 |
| KR | 1020040046702 A | 6/2004 |

* cited by examiner

Primary Examiner—Kathleen Duda
(74) Attorney, Agent, or Firm—Townsend and Townsend and Crew LLP

(57) ABSTRACT

The method for forming a fine pattern of a semiconductor device includes depositing a photoresist film over a semiconductor substrate having an underlying layer, performing a first exposure process using a first exposure mask to form a first photoresist pattern, the first exposure mask defining a first and a second exposure patterns, the first exposure pattern finer than the second exposure pattern, depositing a photoresist film over an entire surface of the resultant including the first photoresist pattern, performing a second exposure process using a second exposure mask to form a second photoresist pattern, the second exposure mask defining a third and a fourth exposure patterns, the third exposure pattern finer than the fourth exposure pattern and disposed between the first exposure patterns, the fourth exposure pattern overlapped with a portion of the second exposure pattern, and patterning the underlying layer using the first and the second photoresist patterns.

9 Claims, 11 Drawing Sheets

METHOD FOR FORMING FINE PATTERN WITH A DOUBLE EXPOSURE TECHNOLOGY

CROSS-REFERENCES TO RELATED APPLICATIONS

The present application claims priority to Korean patent application number 10-2006-0066319, filed on Jul. 14, 2006, which is incorporated by reference in its entirety.

BACKGROUND OF THE INVENTION

The present invention relates to a memory device. More particularly, the present invention relates to a method for forming a fine pattern of a semiconductor device with an improved double exposure technology.

During a photolithography process of a semiconductor device fabrication process, circuit patterns are generally formed over a semiconductor substrate by employing many masks. The photolithography process refers to a process that transfers light onto a photoresist film deposited over a semiconductor substrate via a pattern formed over a mask/reticle to selectively expose the photoresist film. In order to transfer the pattern over a mask/reticle to a semiconductor substrate, a photolithography apparatus for the photolithography process loads a semiconductor substrate into a wafer stage and aligns the loaded semiconductor substrate through an alignment key formed in a scribe lane of the mask/reticle.

BRIEF SUMMARY OF THE INVENTION

Embodiments of the present invention are directed to a method for forming a fine pattern of semiconductor devices with a modified double patterning layout. According to one embodiment, the modified double patterning layout has two separated layouts sharing an overlapping portion with each other.

In one embodiment of the present invention, a method for forming a fine pattern of a semiconductor device, the method comprises: depositing a photoresist film over an underlying layer formed over a semiconductor substrate; performing a first exposure process using a first exposure mask to form a first photoresist pattern, the first exposure mask defining a first exposure pattern and a second exposure pattern, the first exposure pattern finer than the second exposure pattern; depositing a photoresist film over an entire surface of the resultant including the first photoresist pattern; performing a second exposure process using a second exposure mask to form a second photoresist pattern, the second exposure mask defining a third exposure pattern and a fourth exposure pattern, the third exposure pattern finer than the fourth exposure pattern and disposed between the neighboring first exposure patterns, the fourth exposure pattern overlapped with a portion of the second exposure pattern; and patterning the underlying layer using the first photoresist pattern and the second photoresist pattern.

In one embodiment, a method for forming a fine pattern of a semiconductor device, the method comprising: forming a first hard mask layer to a fifth hard mask layer over a semiconductor substrate having a nitride film; forming a first photoresist film pattern over the fifth hard mask layer by using a first mask having a first pattern for forming a fine pattern and a second pattern for forming a connected pattern; etching the fifth hard mask layer by using the first photoresist film pattern to form a fifth hard mask layer pattern; forming a second photoresist film pattern over the fourth hard mask layer including the fifth hard mask layer pattern by using a second mask having a third pattern for forming a fine pattern and a fourth pattern for forming the connected pattern, wherein the first photoresist film pattern and the second photoresist film pattern include a given overlapping portion to form the connected pattern; and selectively etching the fourth hard mask layer to the first hard mask layer by using the first photoresist film pattern and the second photoresist film pattern to form the fine pattern and the connected pattern over the semiconductor substrate.

BRIEF DESCRIPTION OF THE DRAWINGS

FIGS. 1b and 1c are simulation results by using the layout of FIG. 1a.

FIG. 3d is a simulation result by using the first double patterning layout of FIG. 3a.

DESCRIPTION OF SPECIFIC EMBODIMENTS

The present invention relates to methods for forming a fine pattern of semiconductor devices with a modified double patterning layout. The modified double patterning layout has two separated layouts sharing an overlapping portion with each other. Accordingly, the modified double patterning layout provides a considerable process margin to get over the pitch limit according to the wavelength of light and to properly control the overlay of the double patterning process.

Figure 1A:
FIG. 1a is a simplified layout according to a method for forming a fine pattern of a semiconductor device.
Figure 1B:
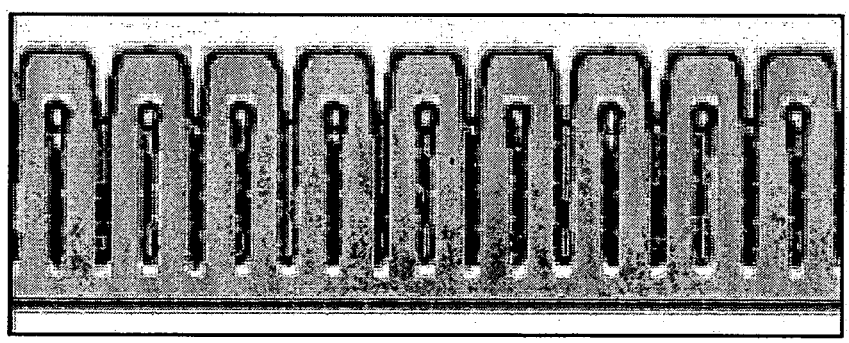
Figure 1C:

FIG. 1a illustrates a simplified layout of a pattern formed over a mask/reticle according to a method for forming a fine pattern of a semiconductor device. FIGS. 1b and 1c show simulation results by using the layout of FIG. 1a with a dry exposure apparatus having a numerical aperture ("NA") of at most 1.

Referring to FIGS. 1b and 1c, bridges may occur between the patterns. If the degree of defocus is about 0.05 μm in comparison with the best focus during the patterning process, poor patterns may be formed over a semiconductor substrate. As the semiconductor device shrinks to smaller sizes, these phenomena will be more prominent. Accordingly, it would be desirable to employ an immersion exposure apparatus that increases NA.

Since the immersion exposure apparatus is very expensive, high initial investment cost is required to install the immersion exposure apparatus. Without employing the immersion exposure apparatus, the limitation on the wavelength of light is get over by using a double exposure technique. Since the double exposure technique divides the original layout into two separated layouts, the pitch of a pattern to be exposed increases twice. That is, a systematic cell region is divided into two parts, and the exposing process for each part is then performed to increase twice of the pitch of the pattern to be exposed.

Figure 2A:
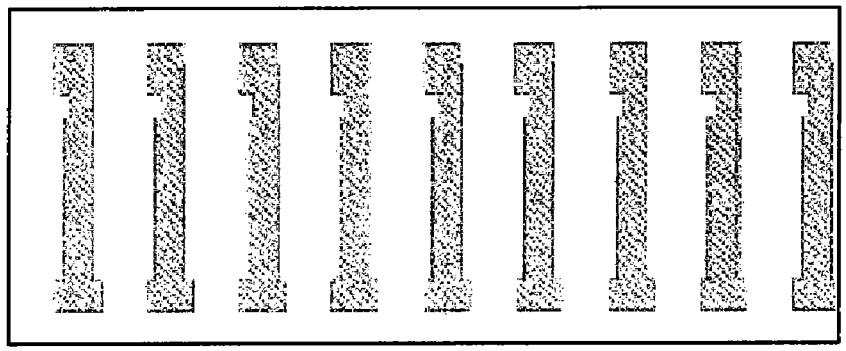
FIG. 2a is a simplified first double patterning layout according to a method for forming a fine pattern of a semiconductor device.
Figure 2B:
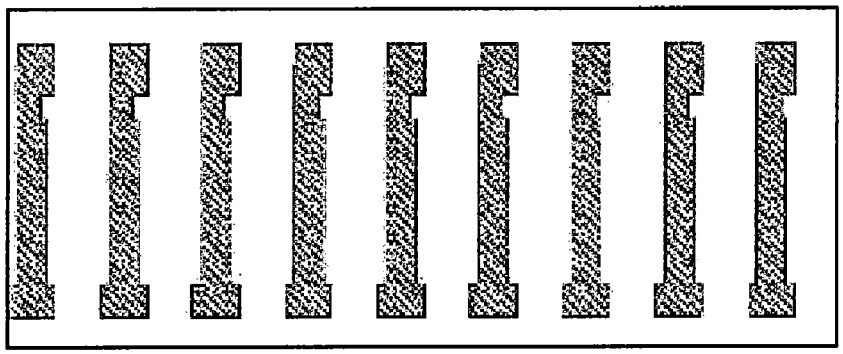
FIG. 2b is a simplified second double patterning layout according to a method for forming a fine pattern of a semiconductor device.
Figure 2C:
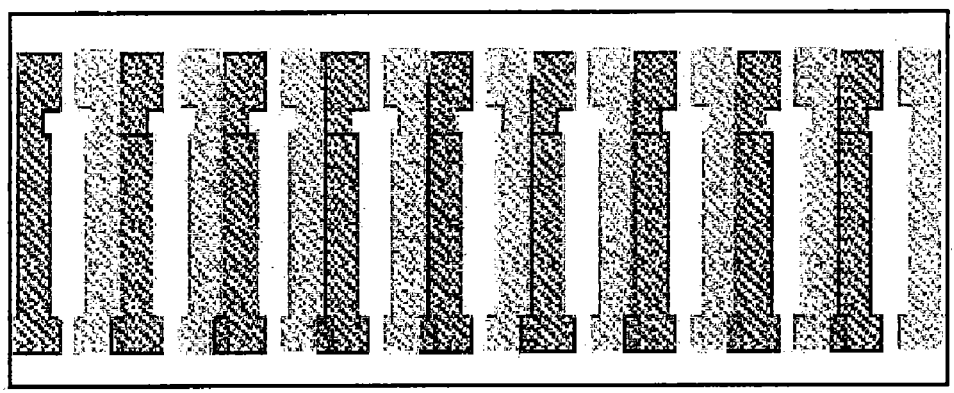
FIG. 2c is a simplified combined layout with the first and second double patterning layouts according to a method for forming a fine pattern of a semiconductor device.

FIG. 2a shows a first double patterning layout for a first mask/reticle according to a method for forming a fine pattern of a semiconductor device. FIG. 2b shows a second double patterning layout for a second mask/reticle according to a method for forming a fine pattern of a semiconductor device. FIG. 2c shows a combined layout with the first double patterning layout and the second double patterning layout. A double patterning process is performed by using the layouts simply splitting the layout of FIG. 1a. The split layouts are shown in FIGS. 2a and 2b. In the double patterning process, the important factor is the overlay between the patterns formed by using the split layouts.

The double pattering process with the simply split layouts is fit for the simple structure. In complex structure, the overlay margin may be insufficient. That is, in this double patterning process, the pattern separation may occur between the first pattern and the second pattern, which are respectively formed by using the first double patterning layout and the second double patterning layout. In other words, the systematically separated patterns in the cell region have the process margin while the connected pattern in the core/peripheral circuit region may have a lack of the process margin. Here, the 'connected pattern' refers to a pattern connected with a first pattern and a second pattern in which the first pattern and the second pattern are formed by using the first and second double patterning layouts. As shown in FIG. 2c, if there is a slight misalignment of the overlay between the patterns, which are formed by using the first mask and the second mask in the double patterning process, the connected pattern may be not formed. In case of the misalignment of the overlay between the patterns, the final pattern is fairly different from the intended pattern. That is, with the sight misalignment of the overlay, the separated patterns in the cell region are clustered in one direction while the pattern to be connected in the core/peripheral circuit region is separated.

Figure 3A:
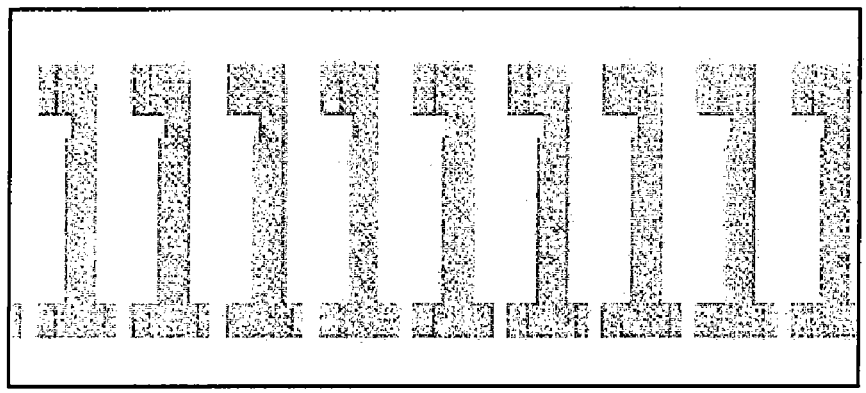
FIG. 3a is a simplified first double patterning layout according to an embodiment of a present invention.
Figure 3B:
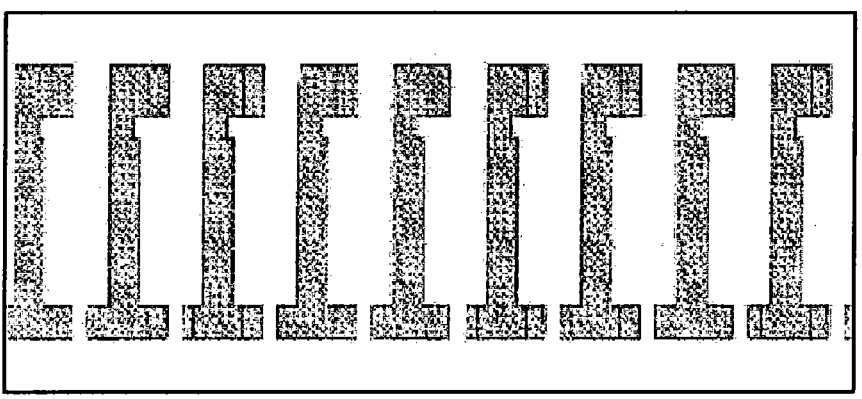
FIG. 3b is a simplified second double patterning layout according to an embodiment of a present invention.

FIG. 3a shows a simplified first double patterning layout according to one embodiment of the present invention. The first double patterning layout includes a first portion corresponding to a fine pattern and a second portion corresponding to a connected pattern. FIG. 3b shows a simplified second double patterning layout according to one embodiment of the present invention. The second double patterning layout includes a first portion corresponding to a fine pattern and a second portion corresponding to the connected pattern. The second portions of the first double patterning layout and the second double patterning layout include an overlapping portion for connecting the second portions. As shown in FIGS. 3a and 3b, the upper part and the bottom part, which correspond to the second portions in the first double patterning layout and the second double patterning layout, share a given overlapping portion.

Figure 3C:
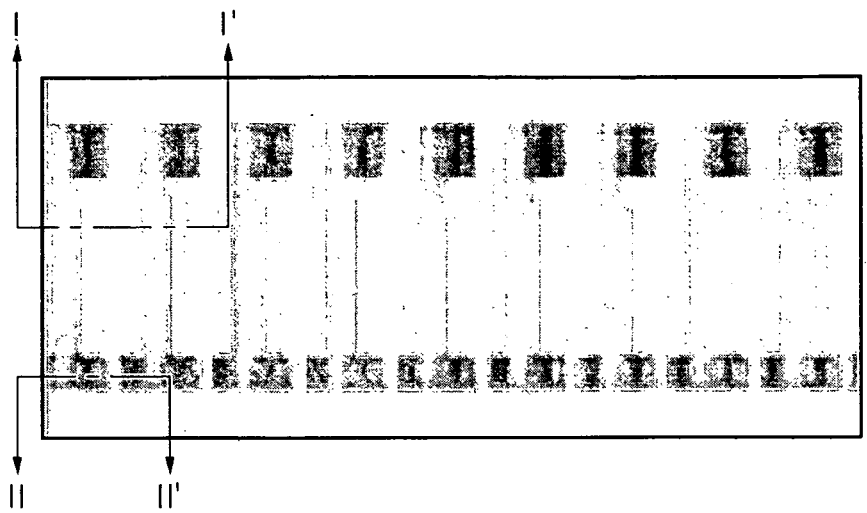
FIG. 3c is a simplified combined layout with the first and second double patterning layouts of FIGS. 3a and 3b according to an embodiment of a present invention.

FIG. 3c shows a combined layout with the first double patterning layout and the second double patterning layout.

Figure 3D:
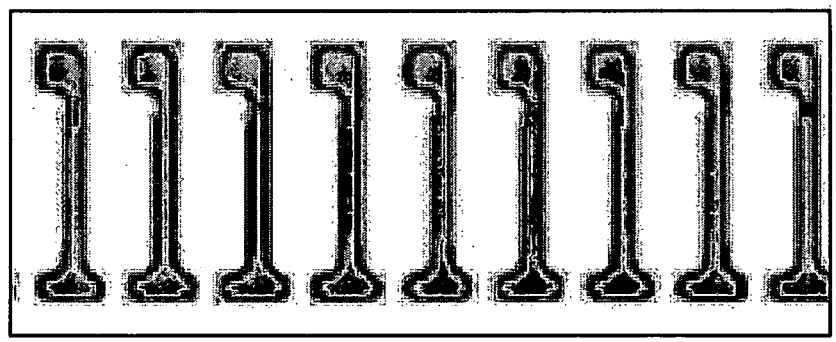
Figure 3E:
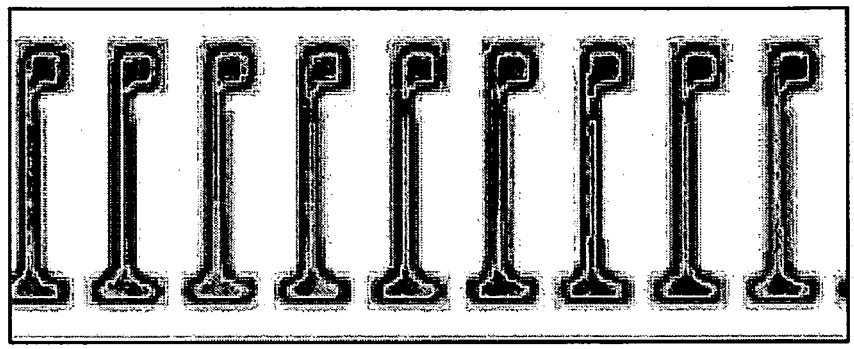
FIG. 3e is a simulation result by using the second double patterning layout of FIG. 3b.
Figure 3F:
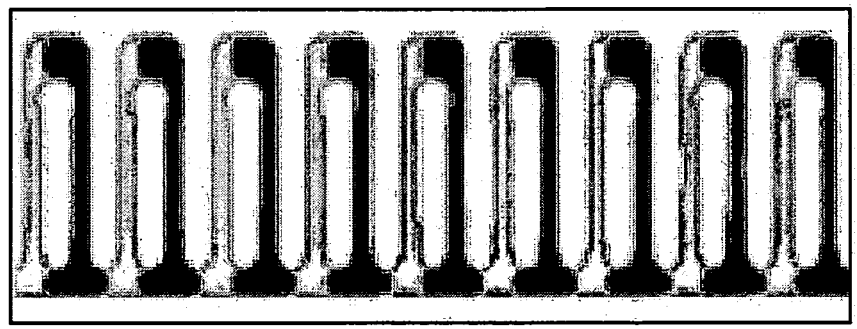
FIG. 3f is a simulation result for the double patterning by using the first and second double patterning layouts of FIGS. 3a and 3b.

FIGS. 3d and 3e respectively show simulation results for the patterning process with the first double patterning layout and the second double patterning layout. FIG. 3f shows a final simulation result for the double patterning process with the first double patterning layout and the second double patterning layout. Since the double patterning layout according to an embodiment of the present invention has a process margin by the overlapping portion, a complicatedly connected pattern in a core/peripheral circuit region can be effectively implemented with a slight misalignment of the overlay.

FIGS. 4a to 4h are simplified cross-sectional views illustrating a method for forming a fine pattern of a semiconductor device according to an embodiment of the present invention. A nitride film 102 serving as an etching mask for a semiconductor substrate 100 is formed over the semiconductor substrate 100. An amorphous carbon layer 104 is formed over the nitride film 102. A first SiON layer 106, a first polysilicon layer 108, a second SiON layer 110, and a second polysilicon layer 112 serving as a hard mask are formed over the amorphous carbon layer 104. In one embodiment of the present invention, the second SiON layer 110 plays a role of barrier between the first polysilicon layer 108 and the second polysilicon layer 112. In addition, the first SiON 106 serves as a hard mask with high etching selectivity in an etching process for the amorphous carbon layer 104.

Figure 4A:
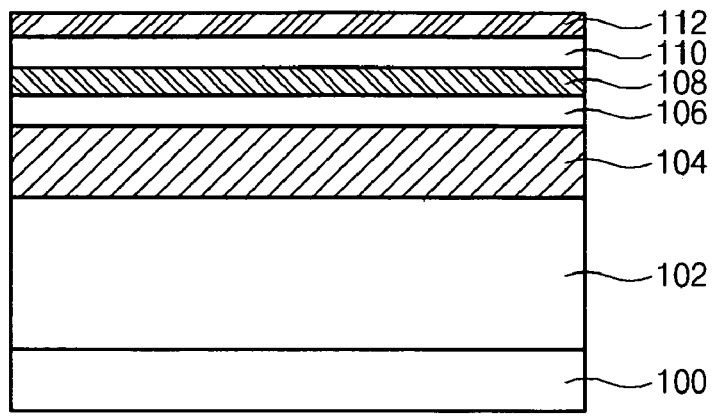
FIGS. 4a to 4h are simplified cross-sectional views illustrating a method for forming a fine pattern of a semiconductor device according to an embodiment of the present invention.
Figure 4B:
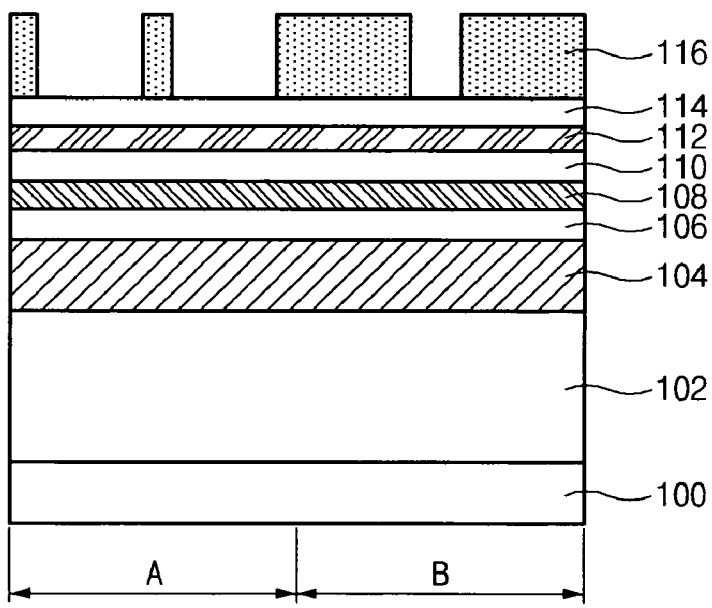

Referring to FIG. 4b, a bottom anti-reflective coating ("BARC") layer 114 is formed over the second polysilicon layer 112. A photoresist film (not shown) is formed over the BARC layer 114. The photoresist film is exposed and developed using a mask formed with the first double patterning layout of FIG. 3a to form a first photoresist film pattern 116. In one embodiment of the present invention, the first photoresist film pattern 116 includes a first region 'A' for forming a fine pattern and a second region 'B' for forming a connected pattern, wherein the first region 'A' is taken along the line I-I' of FIG. 3c, and the second region 'B' is taken along the line II-II' of FIG. 3c.

Figure 4C:
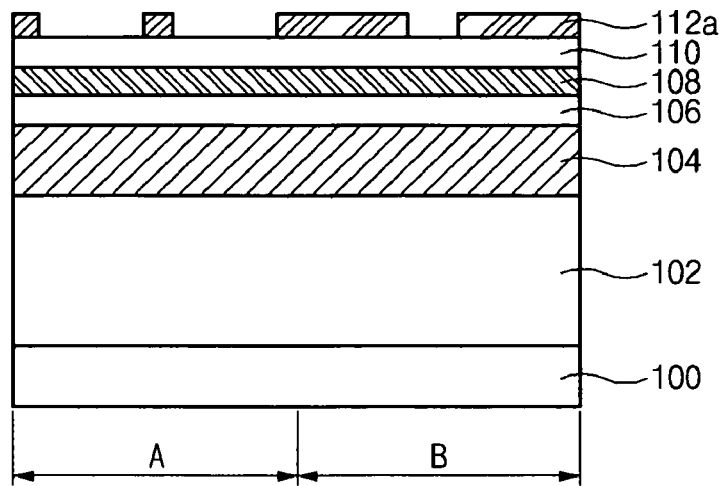
Figure 4D:
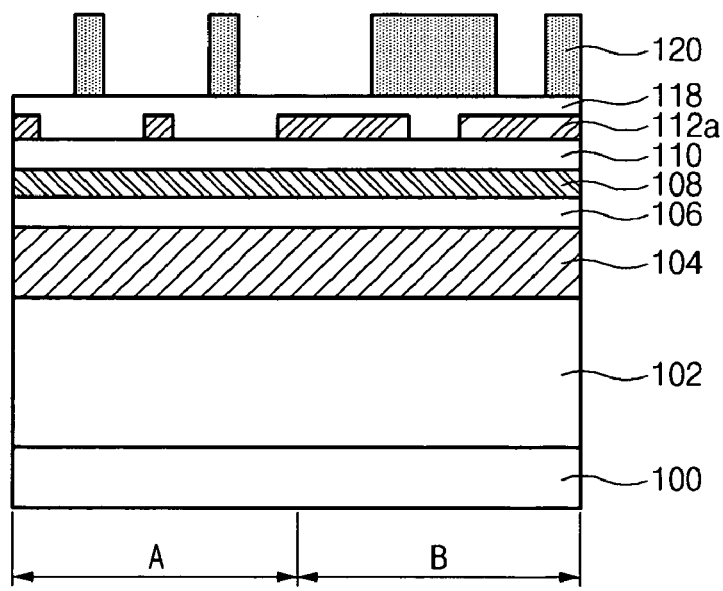

Referring to FIGS. 4c and 4d, the BARC film 114 and the second polysilicon layer 112 are etched using the first photoresist film pattern 116 as an etching mask to form a second polysilicon layer pattern 112a. The first photoresist film pattern 116 and the remaining BARC film 114 are removed. A BARC film 118 is formed over an entire surface of the resultant (i.e. over the second polysilicon layer pattern 112a and the second SiON layer 110) to fill up the second polysilicon layer pattern 112a. A photoresist film (not shown) is formed over the BARC film 118. The photoresist film is exposed and developed using a mask formed with the second double patterning layout of FIG. 3b to form a second photoresist film pattern 120.

Figure 4E:
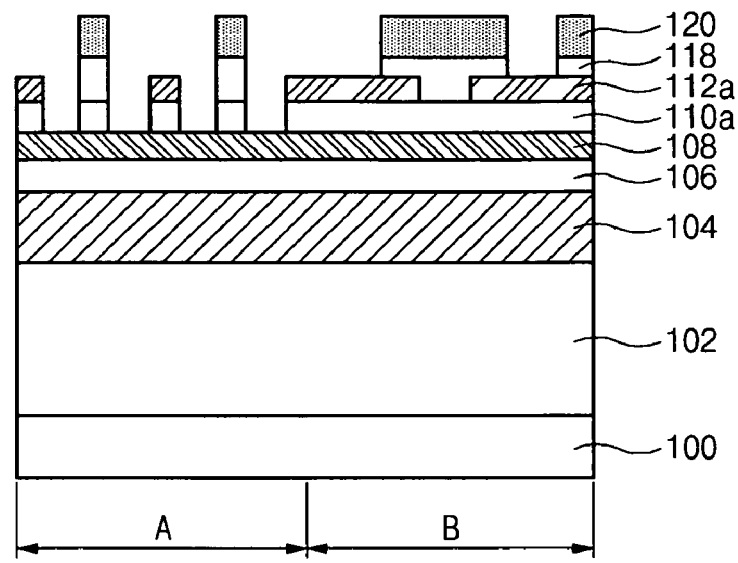
Figure 4F:
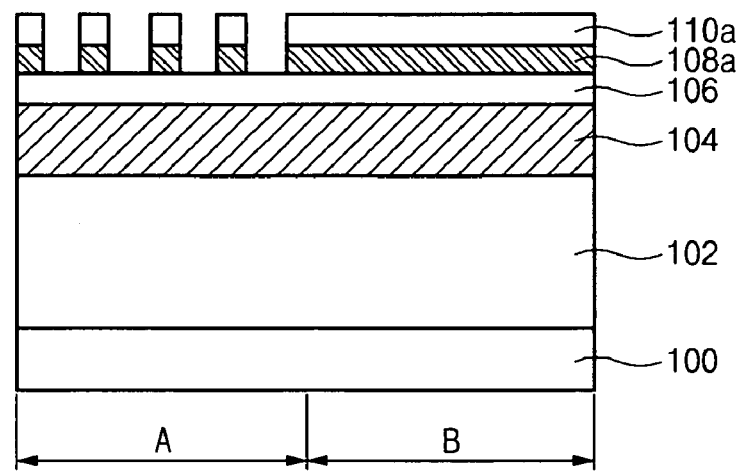

Referring to FIGS. 4e and 4f, the BARC film 118 and the second SiON layer 110 are etched using the second photoresist film pattern 120 as an etching mask to form a second SiON layer pattern 110a. In the region 'A' the second SiON layer patterns 110a having a given narrow distant between the neighboring second SiON layer patterns 110a are formed while the undivided second SiON layer pattern 110a is formed in the region 'B'. The second photoresist film pattern 120, the BARC 118 and the second polysilicon layer pattern 112a are removed. The first polysilicon layer 108 is etched using the second SiON layer pattern 110a as an etching mask to form a first polysilicon layer pattern 108a.

Figure 4G:
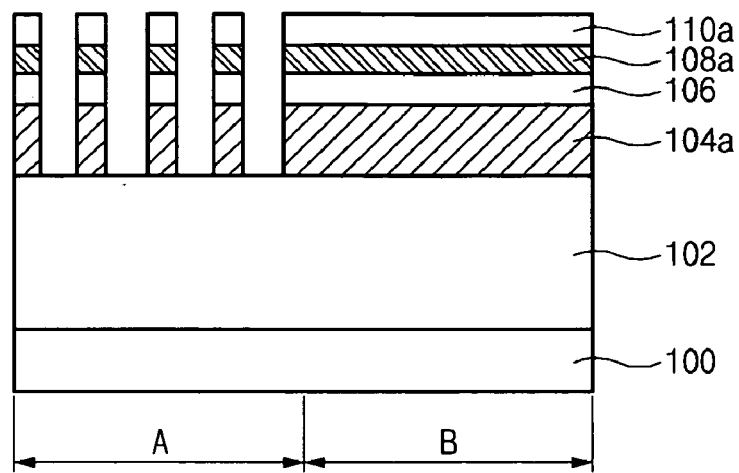
Figure 4H:
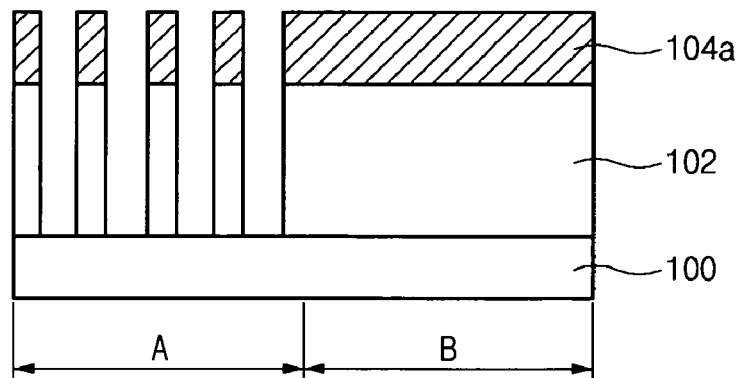

Referring to FIGS. 4g and 4h, the first SiON layer 106 and the amorphous carbon layer 104 are etched using the second SiON layer pattern 110a and the first polysilicon layer pattern 108a as an etching mask to form an amorphous carbon layer pattern 104a. The second SiON layer pattern 110a, the first polysilicon layer pattern 108a, and the first SiON layer 106 are removed. The nitride film 102 is etched using the amorphous carbon layer pattern 104a as an etching mask to simultaneously form the fine pattern and the connected pattern.

As described above, the double patterning layout is modified according to embodiments of the present invention to increase twice of the pitch capable of being exposed. As a result, the limitation on the wavelength of UV light can be overcome. In addition, the connected pattern as well as the fine pattern can be effectively formed with the considerable process margin. Accordingly, the present invention provides the yield and reliability of the device.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or in a non volatile memory device. Other additions, subtractions, or modifications are obvious in view of the present disclosure and are intended to fall within the scope of the appended claims.

What is claimed is:

1. A method for forming a fine pattern of a semiconductor device, the method comprising:

forming a first hard mask layer to a fifth hard mask layer over a semiconductor substrate having a nitride film;

forming a first photoresist film pattern over the fifth hard mask layer by using a first mask having a first pattern for forming a first fine pattern and a second pattern for forming a first connected pattern that includes first and second portions that are separated by a space;

etching the fifth hard mask layer by using the first photoresist film pattern to form a fifth hard mask layer pattern;

forming a second photoresist film pattern over the fourth hard mask layer including the fifth hard mask layer pattern by using a second mask having a third pattern for forming a second fine pattern and a fourth pattern for forming a second connected pattern, wherein the second connected pattern is formed over the first and second portions of the first connected pattern and buries the space between the first and second portions of the first connected pattern to form a wide pattern that covers an area defined by the space; and selectively etching the fourth hard mask layer to the first hard mask layer by using the first photoresist film pattern and the second photoresist film pattern to form the first and second fine patterns and the wide pattern over the semiconductor substrate, wherein the first fine pattern is separated from the second fine pattern.

2. The method according to claim 1, wherein the first hard mask layer is formed of an amorphous carbon layer.

3. The method according to claim 1, wherein the second hard mask layer and the fourth hard mask layer are formed of a SiON layer.

4. The method according to claim 1, wherein the third hard mask layer and the fifth hard mask layer are formed of a polysilicon layer.

5. The method according to claim 1, wherein the first hard mask layer and the second hard mask layer have a difference in etch selectivity.

6. The method according to claim 1, wherein the second pattern and the fourth pattern are formed in a core circuit region or a peripheral circuit region.

7. The method according to claim 1, further comprising forming a bottom anti reflective coating (BARC) film at the interface of the fifth hard mask layer and the first photoresist film pattern.

8. The method according to claim 1, sherein the second photoresist pattern comprises a BARC film formed at the interface of the second photoresist film pattern and the fourth hard mask layer.

9. The method according to claim 1, wherein the wide pattern covers an area defined by a combination of the space and the first and second portions of the first connected pattern.

* * * * *